Feb. 7, 1967 G. SONNENSCHEIN 3,303,058

THERMOELECTRIC MODULE

Filed Dec. 6, 1962

INVENTOR.
George Sonnenschein
BY
Sidney Carter
ATTORNEY

United States Patent Office 3,303,058

Patented Feb. 7, 1967

3,303,058

THERMOELECTRIC MODULE

George Sonnenschein, Santa Monica, Calif., assignor to General Motors Corporation, Detroit, Mich., a corporation of Delaware Filed Dec. 6, 1962, Ser. No. 242,766

6 Claims. (Cl. 136—230)

This invention relates to a thermoelectric module and more particularly to an encapsulated assembly including a semiconductor thermoelectric element adapted for application in an array of a number of units for purposes of heating, cooling or electrical generation in a manner similar to that shown and described in the assignee's copending application Serial No. 237,215, filed November 13, 1962, in the name of Adolph L. Weiss.

In heating, cooling or electric generating devices utilizing the Peltier or Seebeck effects, pairs of dissimilar semiconductor thermoelectric elements are electrically interconnected in an arrangement such as to either pump heat to or extract heat from a particular environment upon passing a direct current through the elements or to generate electricity upon subjecting the opposite ends thereof to different temperatures.

In such systems, particularly thermoelectric power generators, the optimum operating temperatures are sufficiently high as to cause oxidation and/or sublimation of the semiconductor material with resulting decrease in the efficiency of operation of the device. Present designs provide hermetically sealed enclosures filled with inert or reducing gases to protect the semiconductors from such deteriorating effects during operation. A second problem in such systems is the need for elastic loading of the semiconductor elements in order to permit take-up of thermal expansion of the semiconductor elements and other components of the system to ensure good electrical and thermal contact at junction points without breakage. Present designs provide for such expansion by spring loading the semiconductor element.

By the construction of my invention, both elastic loading and hermetic sealing of the semiconductor element are accomplished by a single member, an encapsulating bellows-like member, thereby providing a simple modular construction with greatly improved heat transfer and structural characteristics. Another feature of my invention is the elimination of the bellows-like member from the heat transfer process thus minimizing resistance to heat conductivity and enabling the use of the full cross-sectional area of the semiconductor element at its point of junction with the heat conducting member. This permits the attainment of lower cold end temperatures and thus higher efficiencies than is possible with present constructions.

Other features of my invention will be apparent from the following description of particular embodiments thereof taken in conjunction with the accompanying drawings in which.

Figure 1:
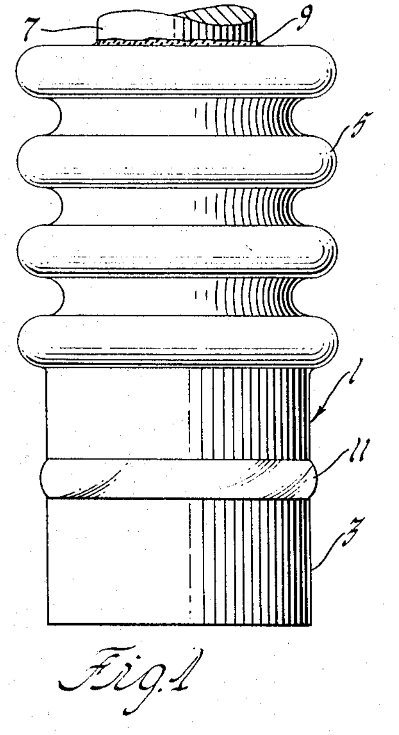
FIGURE 1 is a side elevation view of the device of my invention.
Figure 2:
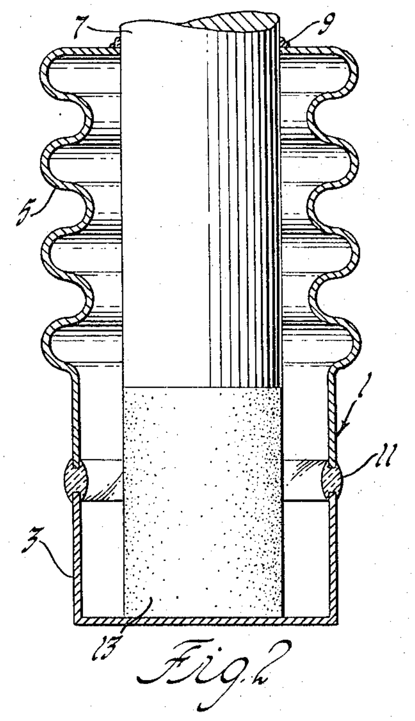
FIGURE 2 is a cross-sectional view of the device shown in FIGURE 1.

As shown in FIGURES 1 and 2, the device of my invention constitutes a sealed module and comprises a bellows-like member 1 having a closed end portion 3 and an open end portion 5 through which a good heat conducting member 7 extends. As shown, the member 1 is a metal bellows having good heat and electrical conductivity, i.e., a brass bellows. The open end of bellows 1 is secured in gas-tight relationship in any suitable manner, as by clamping or by an annular braze or weld 9, to the member 7 shown as a rod formed of aluminum, copper, or other suitable material having good heat and electrical conductivity.

As shown in FIGURES 1 and 2 the closed end portion 3 is electrically insulated from the rod 7 by an annular bead 11 of insulating material which creates a gas-tight seal between the portions 3 and 5. The material of bead 11 approximates the coefficients of expansion and contraction of the bellows at the particular operating temperatures to which it would be subjected. Such sealing materials are well known and readily available on the open market, an example being boro-silicate glass which is commonly used to form a seal between metal parts. Various resinous sealing compounds such as vinyl and epoxy resins may also be used. The electrical insulation of the closed end 3 from the rod 7 may be accomplished by other suitable means as by interposing an insulator between the rod and the open end when joining the two in gas-tight relationship.

While the use of a metal bellows is preferred, the bellows-like member 1 may be formed of other gas-tight materials such as vinyl resin or a resin impregnated fibrous material. Where the material is electrically nonconductive it is of course unnecessary to use the annular bead 11 and portions 3 and 5 may be formed as an integral unit. In this latter case, the closed end would be formed with a metal plate to which the body of the bellows would be secured in order not to interpose a barrier in the heat path of the module and to enable a good electrical interconnection with the thermoelectric element. Also, where the bellows material could not of itself elastically load the thermoelectric element and this was desired, this may be achieved by providing the bellows with resilient means such as a spring.

Figure 3:
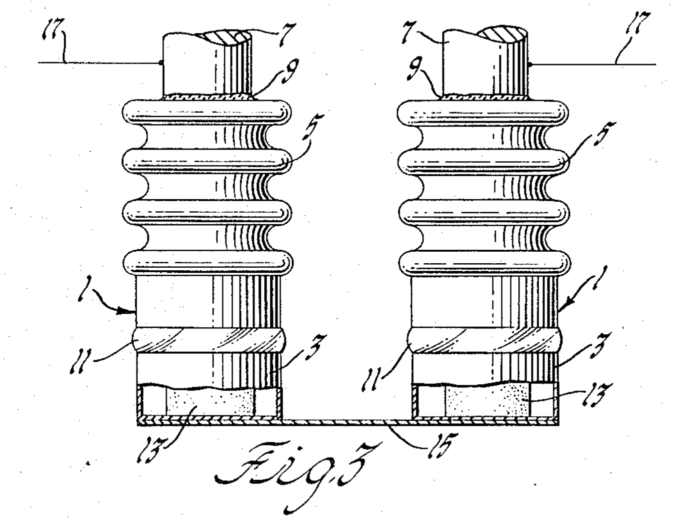
FIGURE 3 is a cross-sectional view of a pair of the devices shown in FIGURE 2 showing their electrical interconnection as used in a thermoelectric array.

A thermoelectric element 13, FIGURES 2 and 3, is positioned in each bellows 1. One end of the element is in good thermal and electrical contact with the end of heat conducting member 7 and the other end is in good thermal and electrical contact with the closed end of the bellows. In assembling the module, the element 13 is either pressed onto or soldered or otherwise joined to the rod and/or the bellows. In assembling the module the bellows 1 is filled with a non-oxidizing gas such as an inert or reducing gas and is sealed about the rod 7 so as to be in tension. The completed module would be designated either P- or N-type according to the conductivity type of the thermoelectric element 13 contained. It should be noted that bellows 1 need not be in tension where element 13 is joined to its respective members in the module, though this is preferred.

As shown in FIGURE 3, electrical connections between modules of my invention are made externally. As described in the above-identified application, metal straps or braids 15, i.e., copper, may be brazed or soldered between the closed ends of a pair of electrically dissimilar modules to form a basic unit or junction in a thermal or electric generating device. Flexible connectors 17 having electrical contact with the rods 7 constitute means for forming a completed electrical circuit through the thermoelectric elements 13.

From the foregoing description, it will be apparent that I have provided a simple construction for elastically loading and hermetically sealing thermoelectric semiconductor elements to constitute a modular assembly of either a P- or N-type according to the conductivity type of the thermoelectric element contained. While I have described my invention in terms of preferred embodiments, it should be understood that other variations will be apparent to those skilled in the art and within the intended scope of my invention as defined by the claims which follow.

I claim:

1. A thermoelectric module comprising a bellows-like member having a closed end and an open end, a thermoelectric element positioned within and having an end in good thermal and electrical contact with the closed end of said member, a good heat conducting member in good thermal and electrical contact with the end of said element spaced apart from said closed end and extending through said open end and having a gas-tight interconnection with said member, and means electrically insulating said closed end from said heat conducting member.

2. A device as set forth in claim 1 wherein said bellows-like member is under tension.

3. A device as set forth in claim 1 wherein said bellows-like member is a metal bellows.

4. A device as set forth in claim 1 wherein said element is joined to said closed end and said heat conducting member.

5. A device in accordance with claim 1 wherein said bellows-like member is a metal bellows secured to said heat conducting member under tension and containing a non-oxidizing gas.

6. A device in accordance with claim 5 wherein said means comprises an annular insulating bead in said bellows separating said closed end from said open end.

No references cited.

ALLEN B. CURTIS, *Primary Examiner.*